US009103864B2

(12) United States Patent
Ali et al.

(10) Patent No.: US 9,103,864 B2
(45) Date of Patent: Aug. 11, 2015

(54) NON-INTRUSIVE CABLE FAULT DETECTION AND METHODS

(75) Inventors: Mohamod Ali, Irmo, SC (US); Rashed H. Bhuiyan, West Columbia, SC (US); Rogor Dougal, Columbia, SC (US); Md Nazmul Alam, Columbia, SC (US)

(73) Assignee: University of South Carolina, Columbia, SC (US)

( * ) Notice: Subject to any disclaimer, the term of this patent is extended or adjusted under 35 U.S.C. 154(b) by 511 days.

(21) Appl. No.: 13/177,331

(22) Filed: Jul. 6, 2011

(65) Prior Publication Data

US 2012/0133373 A1 May 31, 2012

Related U.S. Application Data

(60) Provisional application No. 61/399,052, filed on Jul. 6, 2010.

(51) Int. Cl.
*G01R 31/02* (2006.01)
*G01R 31/12* (2006.01)

(52) U.S. Cl.
CPC .......... *G01R 31/021* (2013.01); *G01R 31/1272* (2013.01); *G01R 31/024* (2013.01)

(58) Field of Classification Search
CPC .................. G01R 31/021; G01R 31/1272
USPC ............................................. 324/543
See application file for complete search history.

(56) References Cited

U.S. PATENT DOCUMENTS

| 2,685,068 | A | | 7/1954 | Goubau | |
|---|---|---|---|---|---|
| 5,016,022 | A | * | 5/1991 | Kershaw | 343/750 |
| 5,512,834 | A | * | 4/1996 | McEwan | 324/642 |
| 7,009,471 | B2 | | 3/2006 | Elmore | |
| 7,515,107 | B2 | * | 4/2009 | Saliga | 343/700 MS |
| 7,567,154 | B2 | | 7/2009 | Elmore | |
| 7,622,931 | B2 | * | 11/2009 | Wu et al. | 324/534 |
| 8,242,969 | B2 | * | 8/2012 | Lutman et al. | 343/906 |
| 2008/0250869 | A1 | * | 10/2008 | Breed et al. | 73/861.27 |

OTHER PUBLICATIONS

Goubau, "Surface Waves and Their Application to Transmission Lines", Journal of Applied Physics, vol. 21, Issue 11, Nov. 1950, pp. 1119-1128.
Williams, "Simple Nanosecond Width Pulse Generator Provides High Performance", EDW Magazine, Nov. 11, 2004—2 pages.

* cited by examiner

*Primary Examiner* — Arleen M Vazquez
*Assistant Examiner* — Feba Pothen
(74) *Attorney, Agent, or Firm* — Dority & Manning, P.A.

(57) ABSTRACT

In accordance with certain embodiments of the present disclosure, a cable fault detection device is described. The device includes a conformal monopole structure and a ground plane structure. The ground plane structure is configured to be generally parallel to the cable longitudinal axis.

15 Claims, 13 Drawing Sheets

NON-INTRUSIVE CABLE FAULT DETECTION AND METHODS

CROSS REFERENCE TO RELATED APPLICATION

The present application claims is based on and claims priority to U.S. Provisional Application Ser. No. 61/399,052, filed Jul. 6, 2010, which is incorporated by reference herein in its entirety.

GOVERNMENT SUPPORT CLAUSE

This invention was made with government support under R00908 awarded by the Office of Naval Research. The government has certain rights in the invention.

BACKGROUND

Surface wave (also known as the Zenneck wave) propagation along a conductor surface is a phenomenon first observed and theoretically investigated many years ago. It has been previously demonstrated that a transmission wire has practical implication as a surface waveguide. If a conductor has a threaded surface over which an electromagnetic (EM) wave can glide or a dielectric coating though which the wave can travel, then surface EM waves can efficiently propagate along the conductor. More recently, a device has been shown which can excite transverse magnetic waves along a single conductor wire. The device includes a conical shape slotted launcher which could be mounted on an existing stranded aluminum overhead power line as shown in FIG. 1. For a transmitter and a receiver placed apart a certain distance along the conductor, it was demonstrated that a bandpass transmission response ($S_{21}$) centered at approximately 2 GHz could be achieved.

However the surface wave devices proposed thus far are not suitable for use with unshielded insulated power line cables used in overhead power lines, industrial settings, inside conduits, shipboard and aircrafts because of their large size, weight, and non-conformal construction.

Thus, improvements in surface wave devices are still needed. The ability for such devices to detect cable faults would be particularly desirable.

SUMMARY

Advantages of the invention will be set forth in part in the following description, or may be obvious from the description, or may be learned through the practice of the invention.

In accordance with certain embodiments of the present disclosure, a cable fault detection device is described. The device includes a monopole structure and a ground plane structure. The ground plane structure is configured to be generally parallel to the cable longitudinal axis.

In certain aspects of the present disclosure, a method of cable fault detection is described. The method includes placing a device around a cable. The device has a monopole structure and a ground plane structure, wherein the ground plane structure is configured to be generally parallel to the cable longitudinal axis. The method further includes detecting a cable fault through utilization of the device.

Other features and aspects of the present disclosure are discussed in greater detail below.

BRIEF DESCRIPTION OF THE DRAWINGS

A full and enabling disclosure, including the best mode thereof, directed to one of ordinary skill in the art, is set forth more particularly in the remainder of the specification, which makes reference to the appended figures in which.

DETAILED DESCRIPTION

Reference now will be made in detail to various embodiments of the disclosure, one or more examples of which are set forth below. Each example is provided by way of explanation of the disclosure, not limitation of the disclosure. In fact, it will be apparent to those skilled in the art that various modifications and variations can be made in the present disclosure without departing from the scope or spirit of the disclosure. For instance, features illustrated or described as part of one embodiment, can be used on another embodiment to yield a still further embodiment. Thus, it is intended that the present disclosure covers such modifications and variations as come within the scope of the appended claims and their equivalents.

Generally, the present disclosure discloses a novel device which is conformal to a power line cable, occupies minimum space, is lightweight, and hence addresses many of the problems of conventional devices. The device is referred to herein as a conformal surface wave (CSW) exciter. To date, communication has been the primary focus of surface wave technology. The device described herein can be used for fault detection of power cables using the time domain reflectometry (TDR) principle.

The present disclosure contemplates detection of cable faults in a variety of forms including open circuit faults, short circuit faults, insulation degradation faults, and the like.

Figure 1:
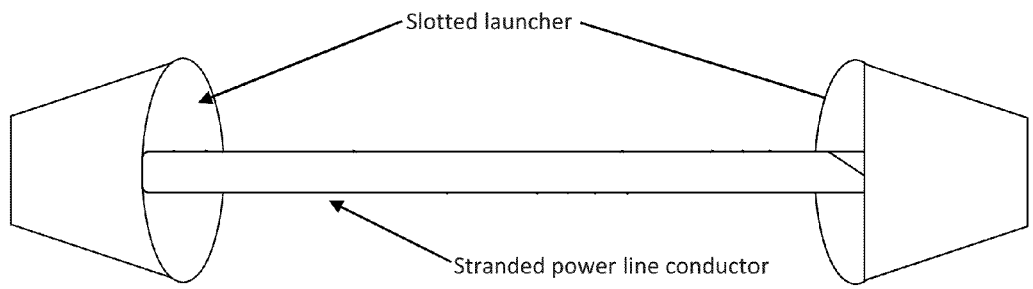
FIG. 1 illustrates a prior art surface wave device.
Figure 2A:
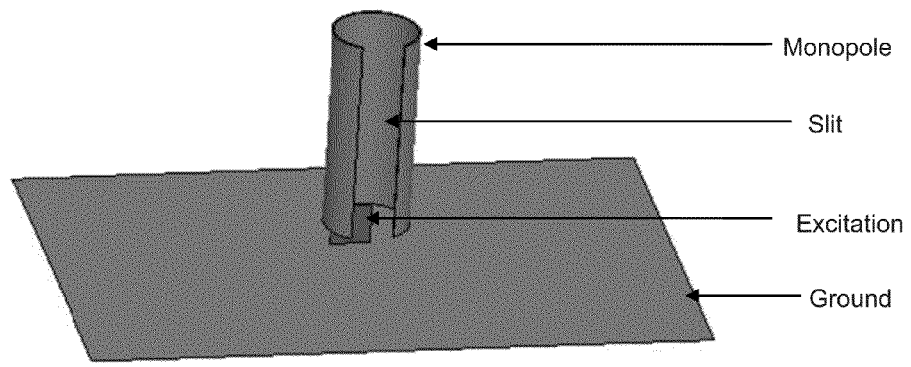
FIGS. 2(a) and 2(b) illustrate a vertical monopole in accordance with certain aspects of the present disclosure.
Figure 2B:
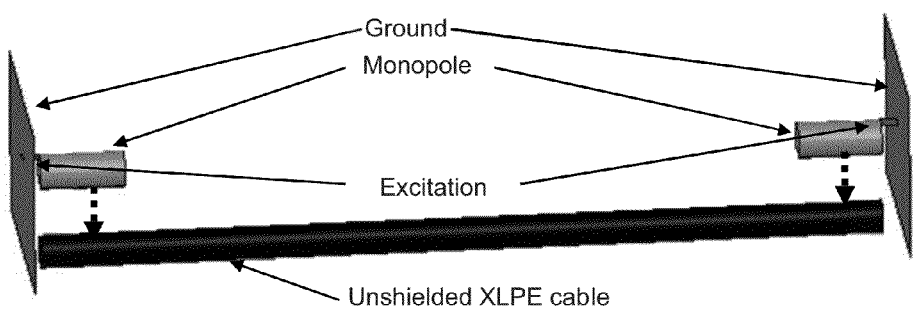

Referring to FIG. 2(b), two monopole antennas were placed at the two ends of a 600 V, XLPE insulation coated unshielded power cable. The cable length was about 214 cm (7 feet). The monopole resonance frequency was 250 MHz in free space. To ensure efficient excitation, monopole arms were made of flexible copper tapes and wrapped around the cable. The monopoles were built vertically on 415 mm by 260 mm ground planes as shown in FIG. 2(a).

Figure 3:
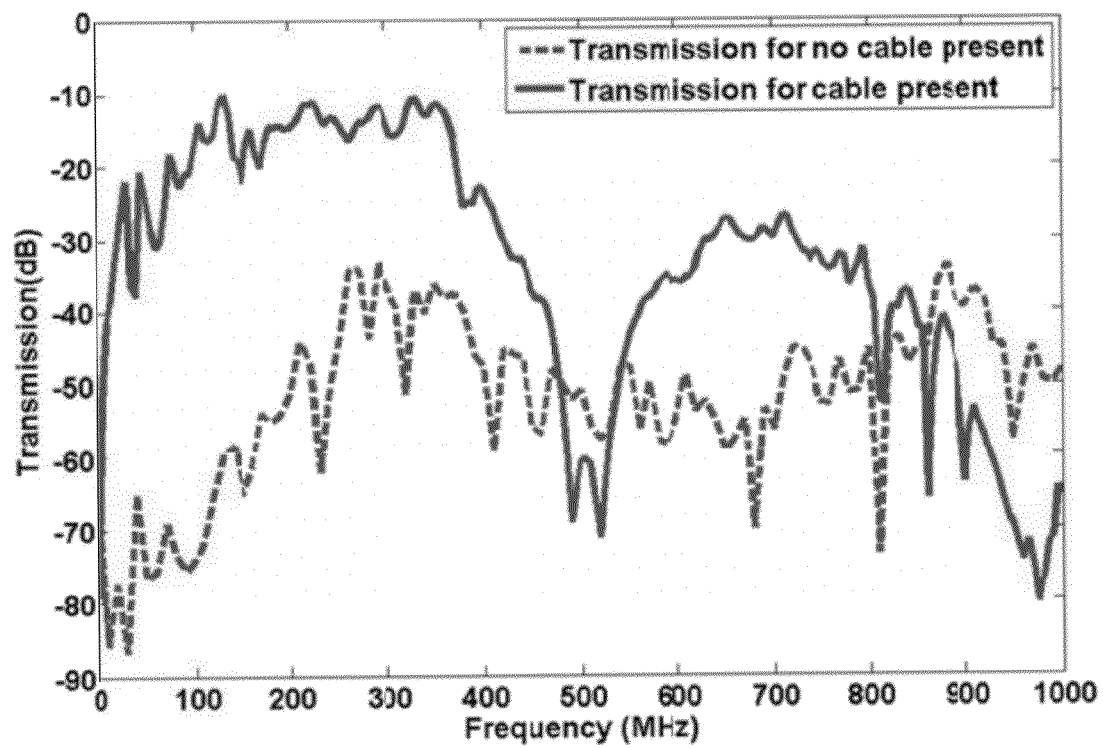
FIG. 3 illustrates transmission response of the vertical monopoles in accordance with certain aspects of the present disclosure.

FIG. 3 shows the transmission performance of the monopoles. The solid curve is the transmission when there was a cable present and the dotted curve is the transmission when there was no cable between the monopoles. It is observed that when no cable is present, the transmission between the antennas is very poor. For this case transmission is mostly around −40 dB to −50 dB and even poorer in the low frequency band, particularly up to 300 MHz. On the other hand, when there is a cable present between the antennas, the transmission increases by 20 dB in most frequency regions. The transmission with cable for up to 400 MHz is much superior compared to the transmission when no cable was present. This result illustrates that a monopole type structure can excite surface wave along a power cable.

Figure 4:
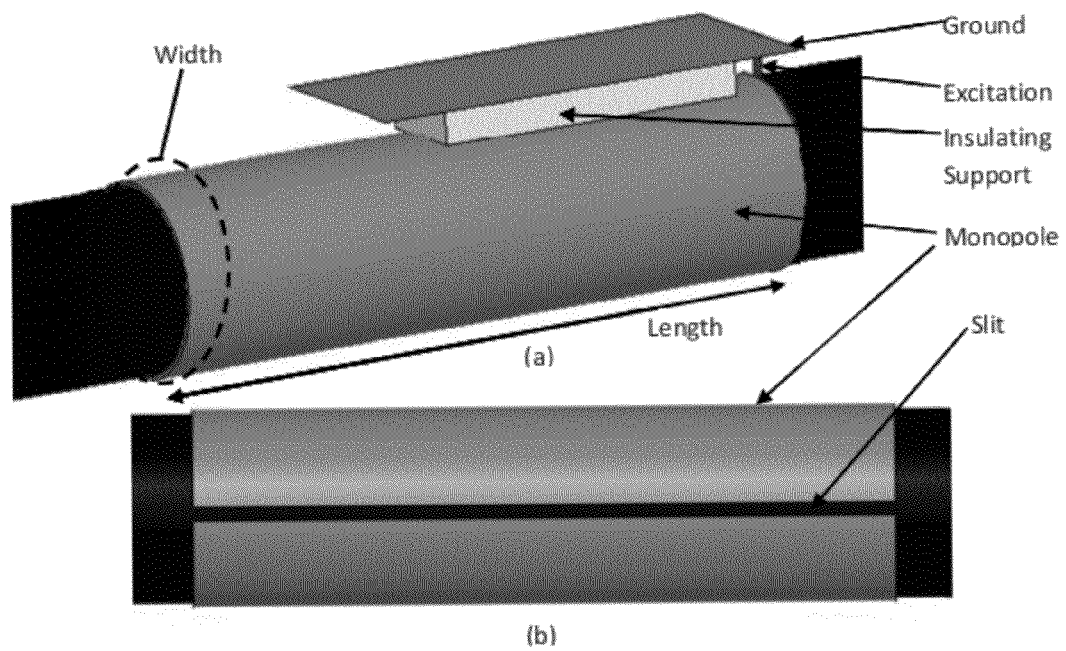
FIGS. 4(a) and 4(b) illustrate a conformal surface wave (CSW) exciter in accordance with certain aspects of the present disclosure with 4(a) illustrating a three dimensional view and 4(b) illustrating a bottom view.
Figure 5:
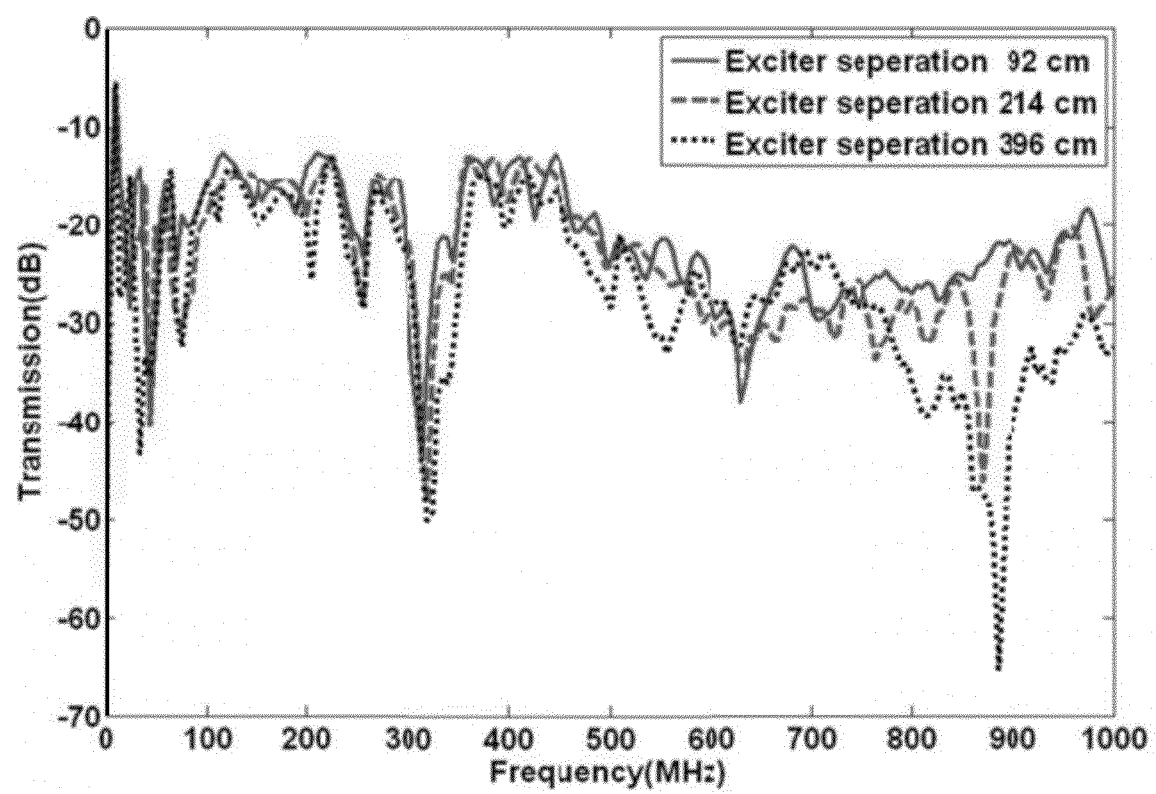
FIG. 5 illustrates transmission response of the CSW device in accordance with certain aspects of the present disclosure.

Due to its vertical construction and size, the monopole as shown in FIG. 2 is not suitable for the locations where space is limited. To overcome this limitation, a novel conformal device as shown in FIG. 4 is described herein. In certain embodiments of the present disclosure, the device has a planar monopole structure with a ground plane. The monopole can be made of flexible copper tape and wrapped around the power cable. The ground plane can also be made of copper tape but it has a very thin paper insulation layer at one side. The ground plane is large compared to the monopole but it has been folded numerous times in such a manner that when folded, the ground plane has a very small area compared to the unfolded version. Unlike the conventional monopole (as in FIG. 2), the ground plane is horizontal (or parallel to the cable axis). This novel alignment makes the monopole structure conformal in nature. Since the device of the present disclosure doesn't operate in the same manner as a conventional antenna and is structurally different, it can be referred to as a conformal surface wave (CSW) exciter or CSW exciter rather than a monopole antenna. However, in certain embodiments the ground plane structure can be made into circular disk with a hole inside. The power line cable will go through the hole. In that case the ground plane can be secured using an appropriate adhesive as would be known in the art. The ground plane can be supported on the monopole with a small piece of insulating material. At the bottom, the monopole defines a slit along its length which is shown in FIG. 4(b). This slit also helps to wrap around or take off the device from the power cable. Two such CSW exciters were placed on the XLPE power cable. Transmission performance was measured by varying the separation between the exciter and the receiver. FIG. 5 shows the transmission performance for separations of 92 cm (3 feet), 214 cm (7 feet) and 396 cm (13 feet). It is observed that transmission does not vary significantly with the change in separation. For all three cases, good transmission performance (transmission>−20 dB) is observed between 95 MHz and 200 MHz band.

Figure 6:
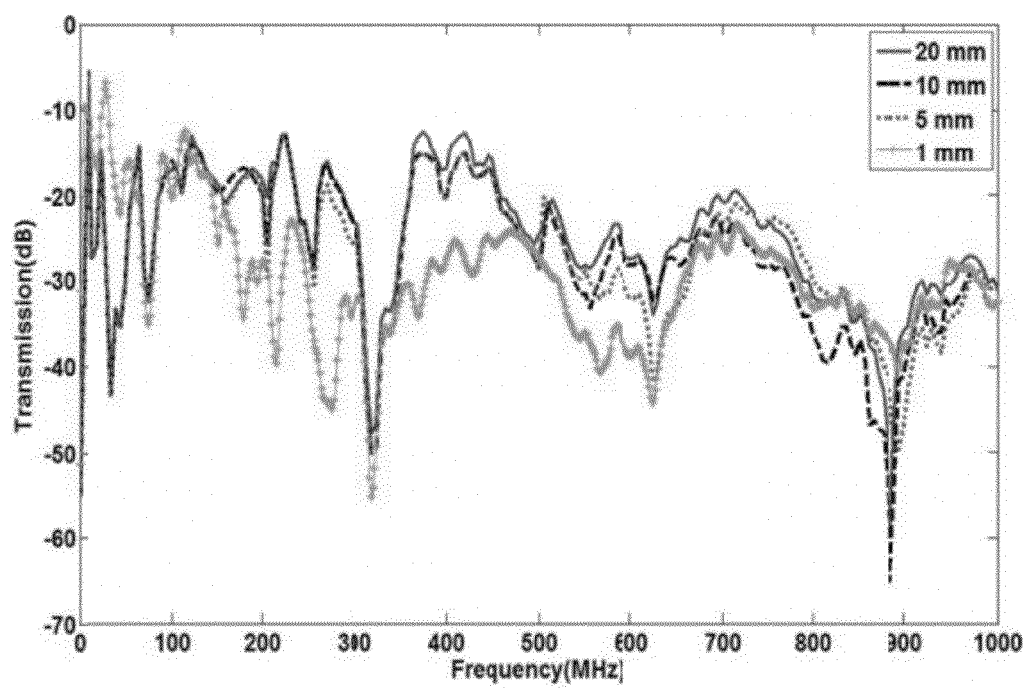
FIG. 6 illustrates the effect of the height of the ground from the monopole on transmission in accordance with certain aspects of the present disclosure.

The performance of the CSW exciter and receiver was determined by varying the ground plane height from the monopole, size of the ground plane, length of the monopole and the width of the monopole. FIG. 6 shows the effect of the height of the ground plane. The ground plane height was varied as 1 mm, 5 mm, 10 mm and 20 mm. For ground plane heights of 20 mm, 10 mm and 5 mm there is no significant effect on the transmission. But when ground plane is too close to the monopole (e.g. 1 mm), transmission deteriorates significantly. Transmission is above −20 dB in between 105 MHz to 115 MHz. This reduction of transmission band occurs because when ground plane is closer to the monopole, the reactive component of the impedance dominates and results in poorer mismatch. Hence to achieve good transmission over a wide bandwidth, the ground plane should be kept more than 1 mm away from the monopole.

Figure 7:
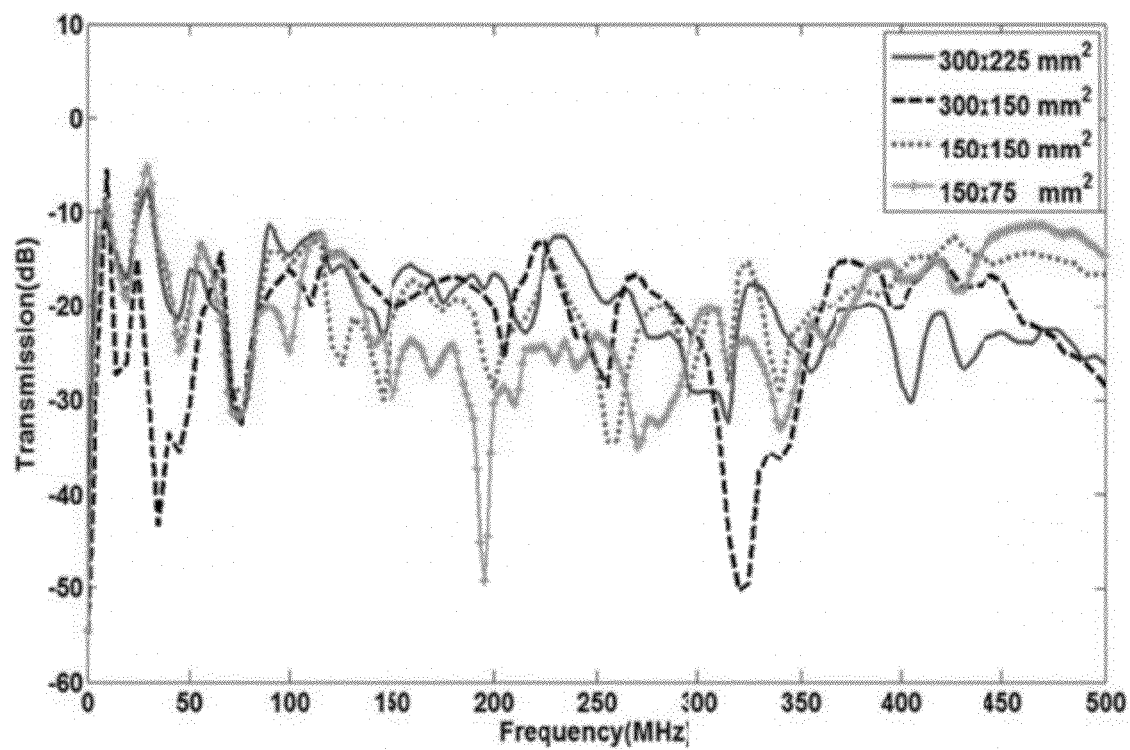
FIGS. 7(a) and 7(b) illustrate effect of ground size on transmission in accordance with certain aspects of the present disclosure.
Figure 7:
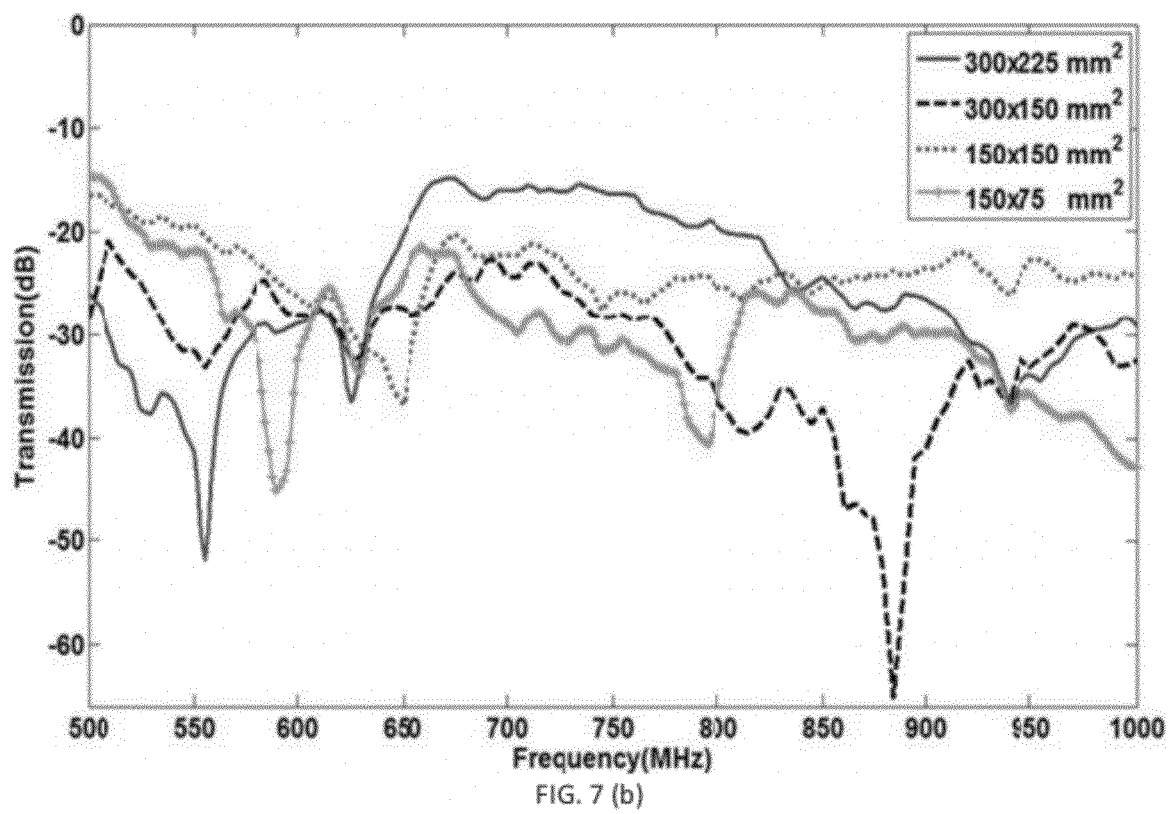

The ground plane sizes used for the experimental measurements were 300 mm×225 mm, 300 mm×150 mm, 150 mm×150 mm and 150 mm×75 mm. FIG. 7(a) shows the transmission performance from 0-500 MHz whereas FIG. 7(b) shows the transmission performance from 500-1000 MHz. For the 300 mm×225 mm ground, transmission is better than −20 dB over the 85-265 MHz frequency band with some occasional spikes at around 145 MHz and 215 MHz. A continuous wideband response is observed from 650 MHz-800 MHz. For the 300 mm×150 mm ground, transmission is better than −20 dB at two bands (90-200 MHz and 365-395 MHz). For smaller grounds like 150 mm×150 mm and 150 mm×75 mm, the −20 dB transmission bandwidth around 100 MHz gets narrower. For the 150 mm×150 mm ground the −20 dB bandwidth extends from 90 to 115 MHz and from 360-550 MHz. For the 150 mm×75 mm ground, the −20 dB bandwidth extends from 105 to 130 MHz and from 380 to 525 MHz. Increasing the size of the ground, the transmission bandwidth at lower frequencies (e.g. around 100 MHz) could be improved. However compromise has to be made between the ground size and performance since a large ground may not be feasible to implement.

Figure 8:
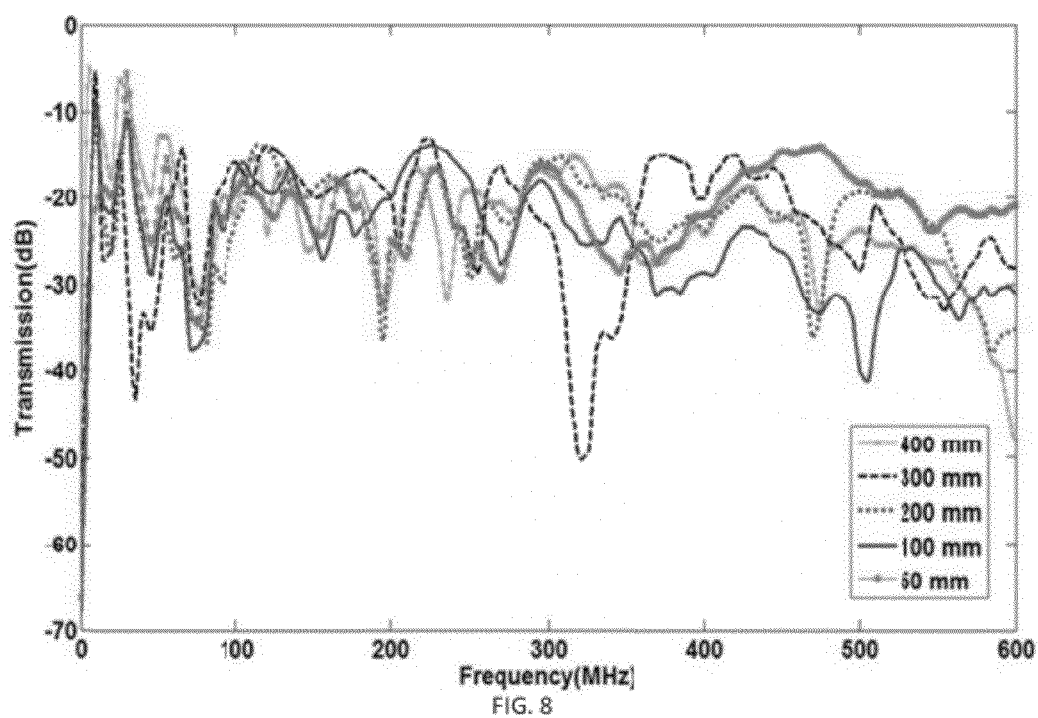
FIG. 8 illustrates effect of monopole length on transmission in accordance with certain aspects of the present disclosure.

FIG. 8 shows the effect of the length of the monopole on transmission. For different lengths, different transmission bands can be found which has transmission response better than −20 dB. For a length of 400 mm the −20 dB transmission band is located between 5 MHz and 70 MHz. When the length is reduced to 300 mm, the transmission band shifts to from 90 MHz to 200 MHz. Similarly, for a length of 200 mm, the transmission band is observed between 110 MHz and 170 MHz. For monopole lengths of 100 mm and 50 mm, the corresponding transmission bands are from 200 MHz to 250 MHz and from 410 MHz to 530 MHz, respectively. It is evident that the length of the monopole has a significant tuning effect of the surface wave propagation band.

Figure 9:
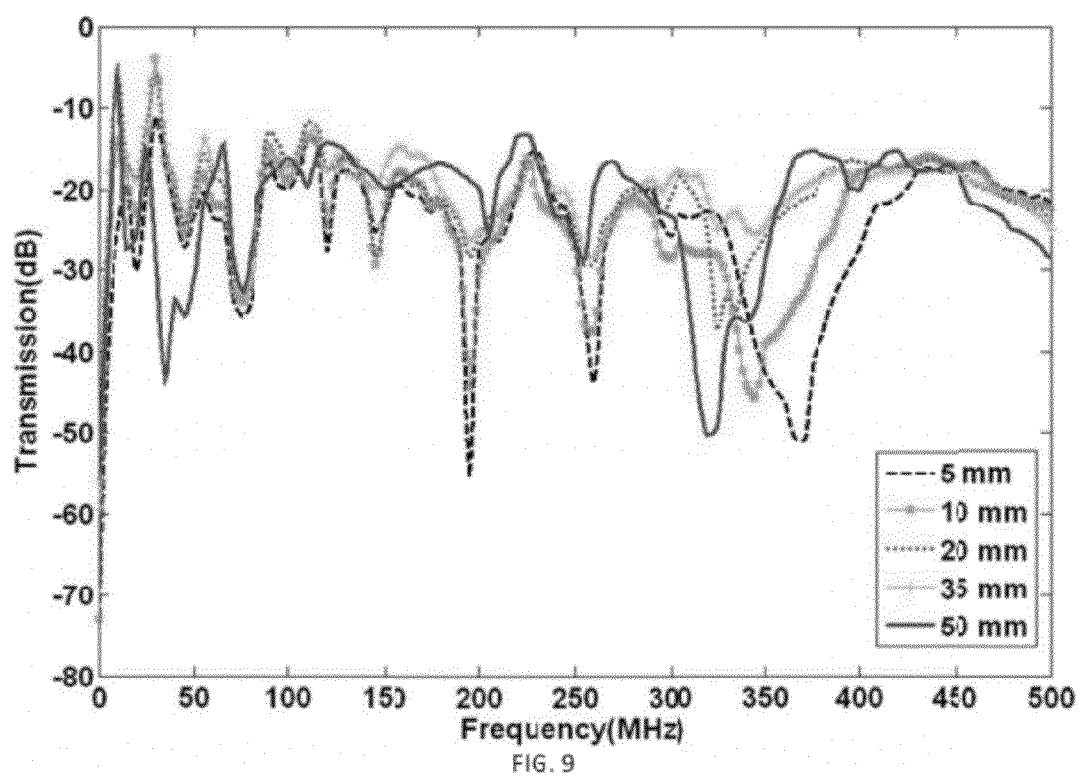
FIG. 9 illustrates effect of monopole width on transmission in accordance with certain aspects of the present disclosure.

The effect of the width of the monopole on the performance of the CSW device was also determined as illustrated in FIG. 9. The width was changed as 5 mm, 10 mm, 20 mm, 35 mm and 50 mm. When the widths were increased from 5 mm to 10 mm, transmission did not vary significantly. For 20 mm, 35 mm and 50 mm, significant variation of bandwidth around 100 MHz region is observed. For these cases, the corresponding −20 dB transmission bands were found from 90 MHz to 130 MHz, from 90 MHz to 175 MHz and from 90 MHz to 200

MHz, respectively. Thus by increasing the width of the monopole, the transmission bandwidth can be increased but the maximum width cannot exceed the perimeter of the cable cross section (perimeter=π×(conductor diameter+total insulation thickness)).

Figure 10:
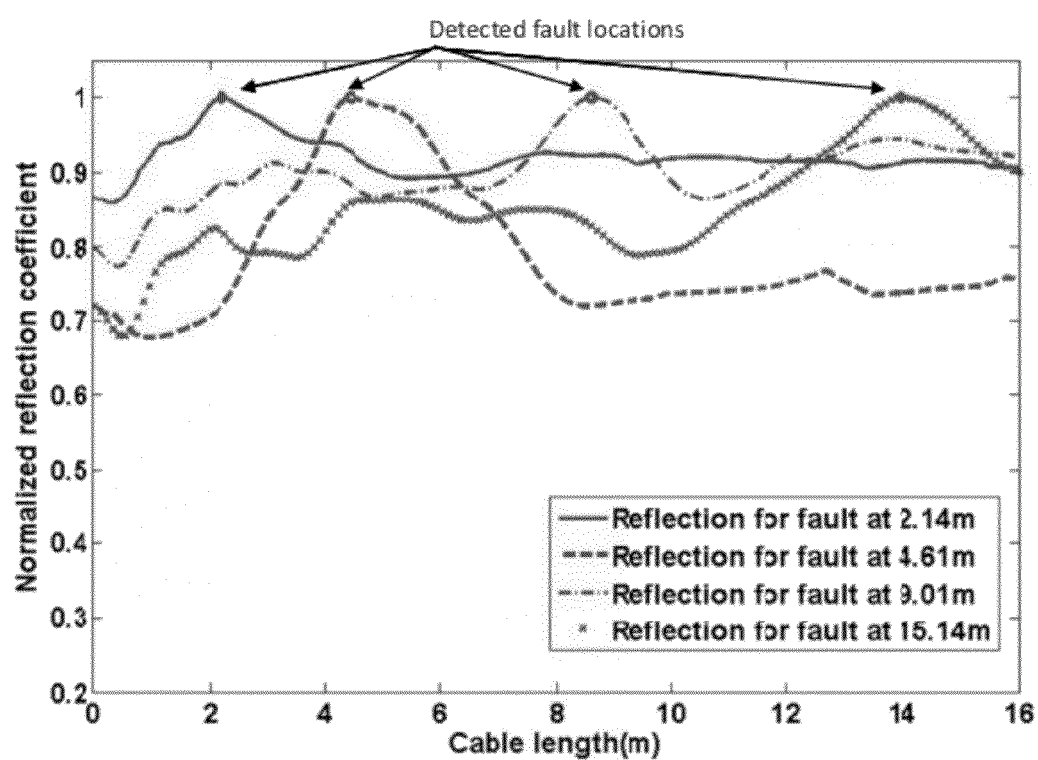
FIG. 10 illustrates reflection from the open fault locations using the CSW device in accordance with certain aspects of the present disclosure.
Figure 11:
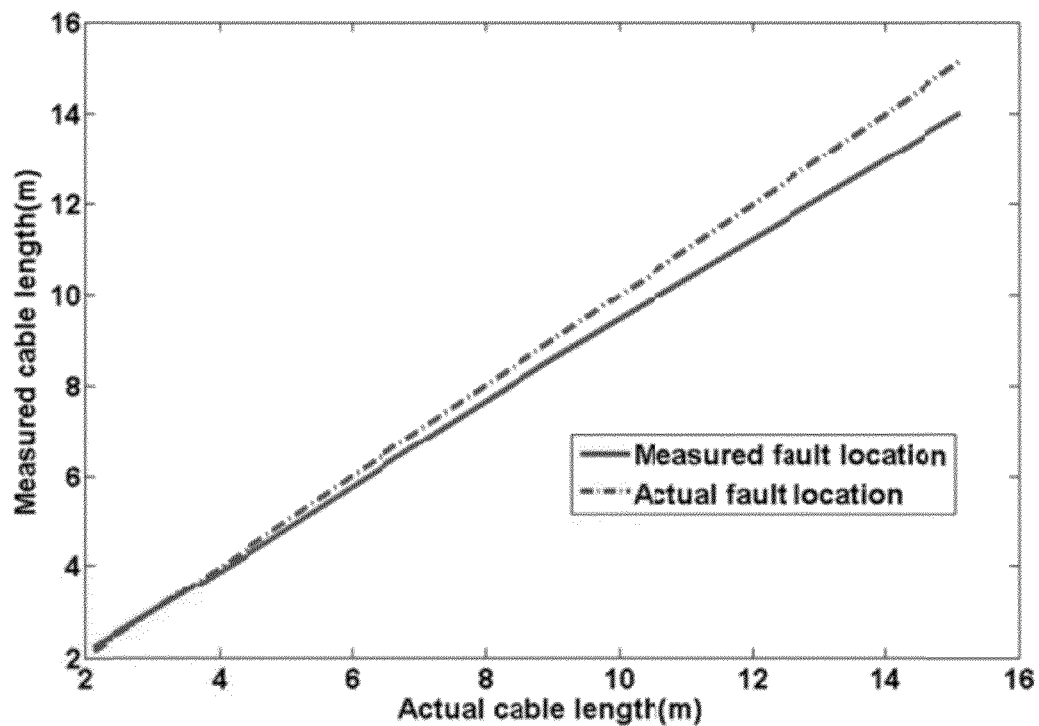
FIG. 11 illustrates detected fault location versus actual fault location in accordance with certain aspects of the present disclosure.

The CSW device described herein was used to detect open circuit faults using time domain reflectometry (TDR) technique. This technique is referred to herein as conformal surface wave non-intrusive time domain reflectometry (CSW-NTDR) technique. The length and width of the monopole were 300 mm and 50 mm while the ground size and ground height were 300 mm×150 mm and 10 mm, respectively. A CSW exciter was placed at one end of a cable and an open circuit fault was created at four arbitrary locations i.e., at 2.14 m (7 feet), 4.61 m (15 feet), 9.01 m (30 feet) and 15.14 m (50 feet) away from the CSW device. The CSW device was connected to a vector network analyzer (VNA) which excited the CSW device with a step signal. The step signal propagated along the power cable and was reflected from the open fault and returned to the VNA. The VNA is capable of showing the round trip time required for the step signal. The time information can be converted into length of the cable traversed by the step signal. FIG. 10 shows the reflection from the fault plotted against the length of the cable. The reflections were normalized with respect to the maximum reflection value. Maximum reflection occurs from the open circuit fault. So the fault location can be found by locating the peak point of the reflection curve. The detected fault locations are marked as circles on the curves. The deviation of the detected fault location from the actual fault location is shown in FIG. 11. It was found that all the fault locations detected by the CSW-NTDR technique were within 8% of the actual fault locations.

Figure 12:
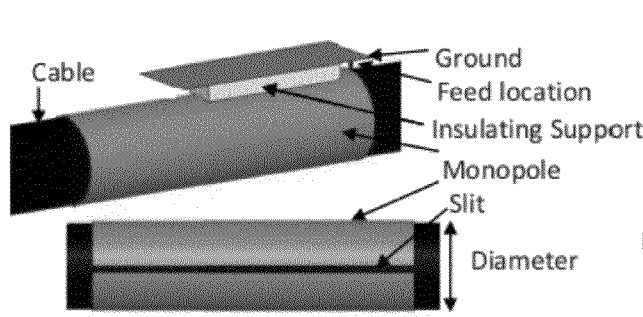
FIG. 12 illustrates a device in accordance with certain aspects of the present disclosure.

The device of the present disclosure can have a simple cylindrical geometry which could be built by using flexible conductive tapes or foils made from copper, aluminum, or the like, for ease of fabrication. The device also can include a conformal monopole arm and a ground plane as shown in FIG. 12. This type of structure is easily wrappable around the cable and hence occupies minimal space. Such a configuration is convenient where space is limited like inside conduit, in underground cable, shipboard and aircraft cable.

Figure 13:
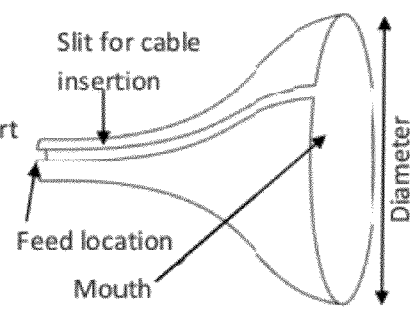
FIG. 13 illustrates a conical horn launcher.

Conventional devices are typically conical horns as shown in FIG. 13. As is evident such a construction has no ground plane but a wide cone mouth. Such devices are not conformal and require much more space and mostly suited for overhead power lines. They are cast or formed from either multiple flat sheet metal subsections or three dimensional exponentially tapered curved metal surface or from a non-conducting material and metalized after fabrication. The device of the present disclosure can be cheaper to manufacture and much lighter in weight. Another important aspect of the device of the present disclosure is that its onboard electronic circuitry injects a high frequency signal using the described surface wave device. Thus the power line cable does not need to be disconnected from the system. Furthermore, by utilizing the device of the present disclosure, there will be no need to carry costly equipment and personnel since the whole system can be wirelessly controlled and monitored.

The device of the present disclosure is designed to work in the low frequency region. When used on a real power cable, the device exhibits good transmission performance at around about 100 MHz. At this frequency, the device can have a diameter of about 14 mm, ground height of about 5 mm and length of about 300 mm. The diameter expands along the axis vertical to cable axis, so it determines the space occupied by the device. The frequency of operation of the device is determined by the length of the monopole whereas for horn type of structures, it depends on the mouth diameter. Extending the monopole length along the cable does not require extra space. At 100 MHz band, the present device is significantly smaller than conventional existing conical horn launchers.

Furthermore, conical horn launchers require coaxial feed for excitation. Due to geometrical advantage, the device of the present disclosure can be excited using either a coaxial feed or a chip miniature circuit. As an example, for time domain reflectometry measurements, a step pulse could be generated using simple pulse generating chips which could be directly connected between the ground and the monopole of the device of the present disclosure. These chips could also be integrated with a chip wireless module and miniature antenna for wireless data transfer. In addition, the device described herein can be integrated inside the jacket of the cable or housing or conduit of the power conductor. The device can also work inside a shielded power cable, if the monopole arms are placed beneath the shielding. In this manner, the devices of the present disclosure are useful for non-intrusive fault diagnosis of power cable.

The CSW device can be powered as would be known to one of ordinary skill in the art by batteries or the like. In addition, an energy harvesting system that exploits electromagnetic (EM) induction such as that described in application Ser. No. 12/631,175, incorporated by reference herein, can also be used in connection with the present disclosure. Briefly, such a system utilizes an energy coupler which can harvest energy from a current carrying conductor (such as the power cable discussed herein) in a power system.

The following examples are meant to illustrate the disclosure described herein and are not intended to limit the scope of this disclosure.

EXAMPLES

Figure 14:
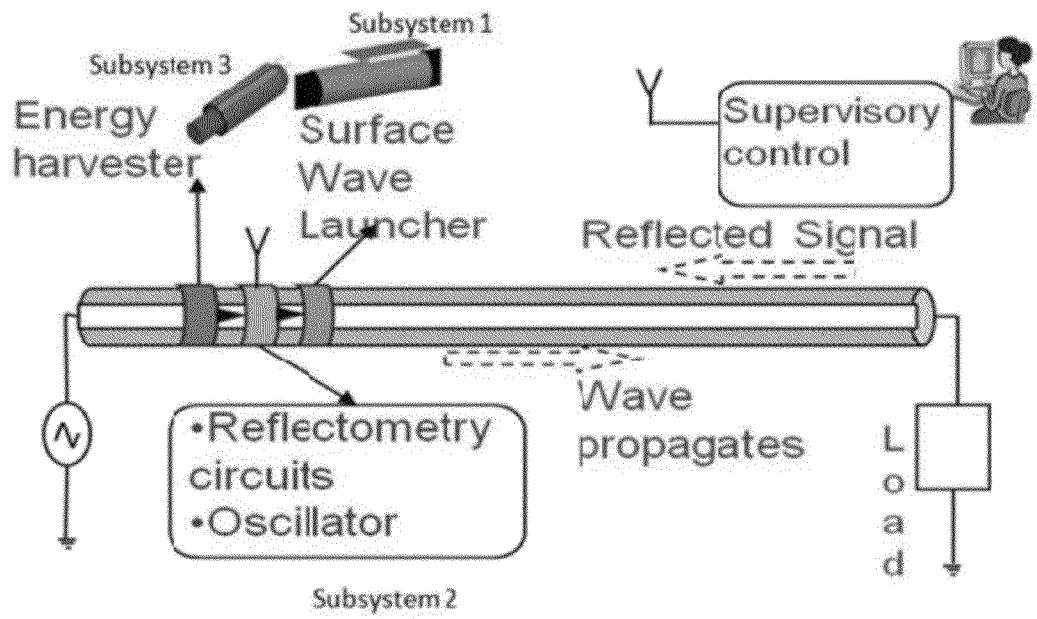
FIG. 14 illustrates a system in accordance with certain aspects of the present disclosure.

The system of the present disclosure can include three major parts or subsystems as illustrated in FIG. 14.

Subsystem 1 is a surface wave launcher which will excite an external RF or reference signal into an unshielded cable. Then this reference RF signal will propagate through the metal dielectric interface. Subsystem 2 includes various circuits including pulse generator circuit, pulse detection circuit and oscillator circuit. This allows for detection and location of a hard fault such as an open circuit on the spot and sending of an emergency signal to a control station. For detecting small defects such as insulation degradation which can create hard faults in the future, the return signal will be transmitted to the control station which will have the necessary facility to analyze and review the condition of the cable on a regular basis. The purpose of subsystem three is to harvest energy for the sensor node and make the system autonomous.

A rectangular pulse circuit is easier to construct than other kinds of pulses. A rectangular pulse of duration τ is defined as $$p(t) = \begin{cases} 1, & 0 < t < \tau \\ 0, & \text{elsewhere} \end{cases} \quad (1)$$

The energy spectrum is $$|p(f)|^2 = \left(\frac{\sin(\pi f \tau)}{\pi f}\right)^2 = T^2 \text{sinc}^2(f\tau) \quad (2)$$

The power spectral density has maximum at f=0 and zeros for $$f = \frac{2n}{\tau},$$

where n is a non zero integer. Taking bandwidth as fist zero power spectral density, the bandwidth of the signal is $$S = \frac{1}{T}.$$

So if the pulse width of the rectangular pulse is 4 ns the bandwidth will be 250 MHz.

Figure 15:
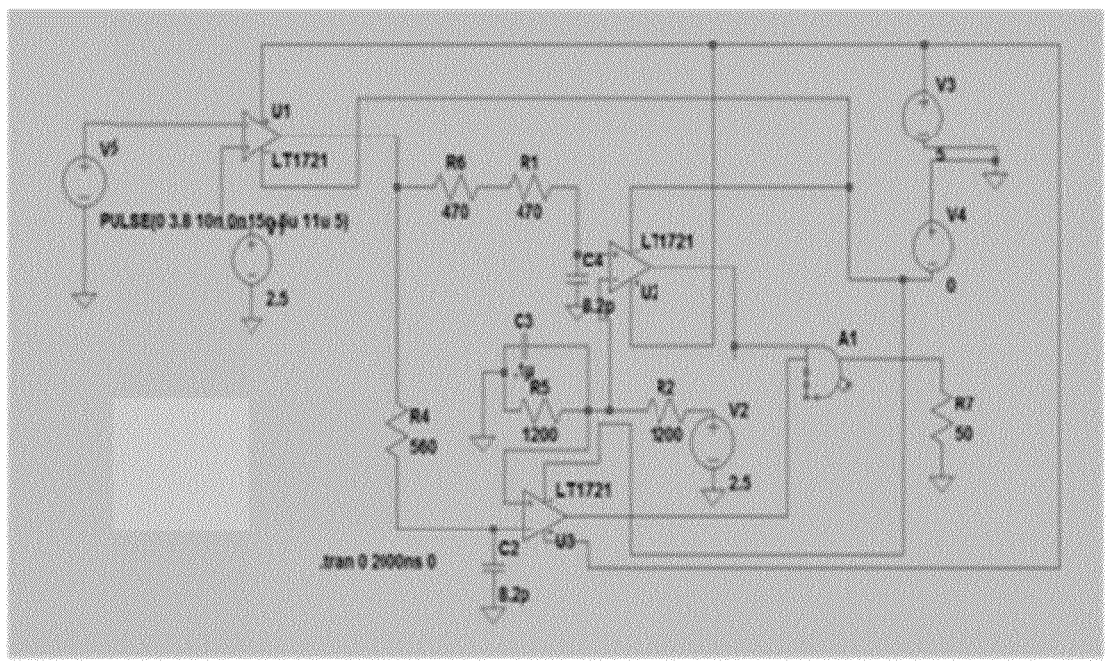
FIG. 15 illustrates a schematic diagram of a pulse generating circuit in accordance with certain aspects of the present disclosure.

Ultra narrow pulses (e.g. 4 ns) are not easy to generate without complicated signal processing. A nS pulse generator circuit was designed by J. Williams of Linear Technology and was published in EDN Magazine under the title "Simple nanosecond-width pulse generator provides high performance", incorporated by reference herein. Here a modified design, as illustrated in FIG. 15, was utilized. Because U1 inverts the input pulse and it also offers high isolation there is no loading effect on the generating circuit. When a signal greater than 2.5V enters the input, the state of the output changes. Comparators U2 and U3 arranged as complementary-output-level detectors represent the networks delay difference as edge-timing slew. As the value of the capacitors s are the same. The difference between the combination of R6 and R1 resistances to R4 resistance determine the net charging time. Also delay is introduced by the comparator and the gate. So the complementary outputs, the output voltage of U3 and U2 overlaps for a few nanoseconds due to a time delay, produce a positive nanosecond pulse at the output of gate A1. The output is more similar to a Gaussian pulse than a rectangular pulse. It is understandable because due to slew rate of the components and bandwidth limit of the used cables, the transaction between the on and off states, is not so fast.

The equation of the Gaussian pulse is $$V_g(t) = V_0 \exp\left(-\frac{t^2}{2\sigma^2}\right) \quad (3)$$

Figure 16A:
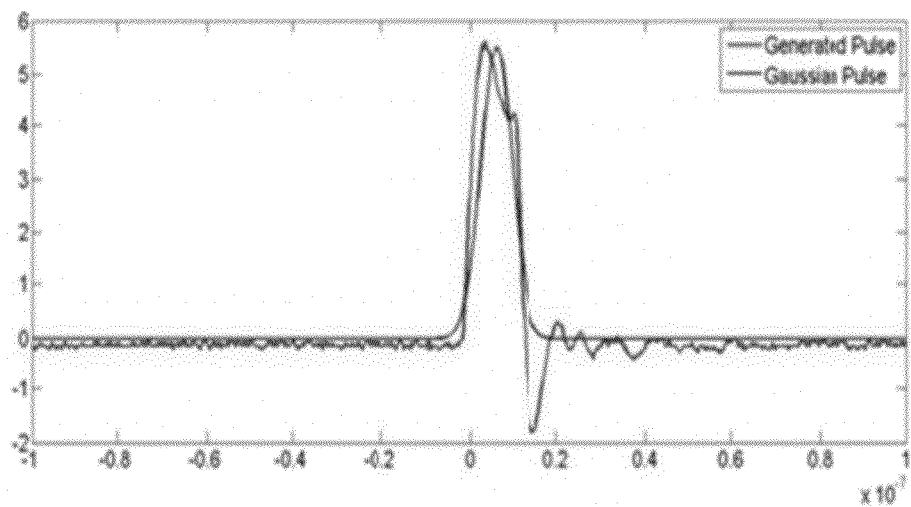
FIG. 16(a) illustrates comparison of the generated pulse and a Gaussian pulse in accordance with certain aspects of the present disclosure.

Here, $V_0=5.56V$, $\sigma=2.5725e-9$ s and the pulse width (full width at half maximum or FWHM) is $2.36\sigma=6.07e-9$ s$\approx$6 ns. The first ringing voltage is 1.75 volt which is 31% with respect to amplitude and other ringing level with regard to amplitude of the signal is 5.42%. Reference is made to FIG. 16(a).

To generate the reference signal, the aforementioned pulsed generator was utilized. To separate the reflected signal from the transmitted signal, a mini surface mount 10 dB coupler ADC-10-1R was utilized. The pulse generating circuit was connected with the coupler with the CSW exciter on top of it.

Figure 16B:
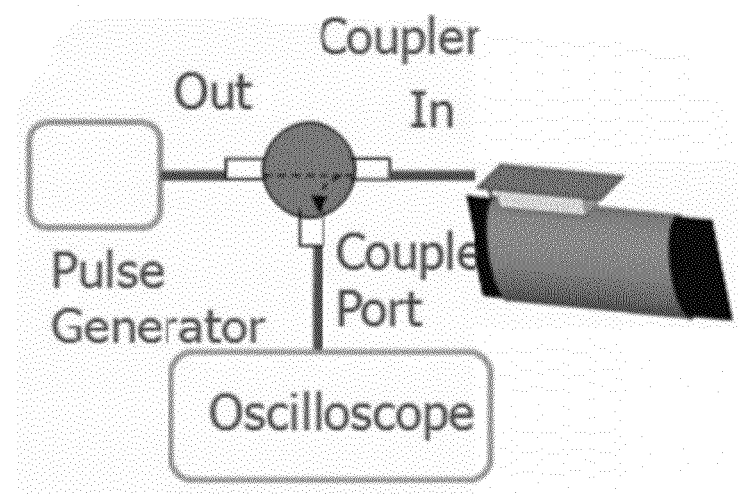
FIG. 16(b) illustrates experimental connection of a pulse generating circuit, a coupler and the CSW exciter in accordance with certain aspects of the present disclosure.
Figure 17:
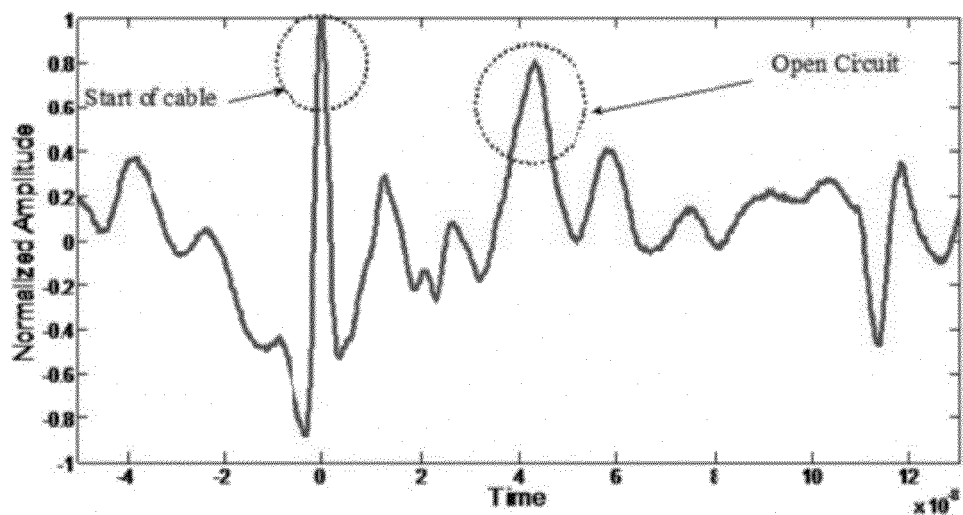
FIG. 17 illustrates normalized amplitude of the return signal from an open fault in the cable located 14 feet away from the exciter in accordance with certain aspects of the present disclosure.
Figure 18:
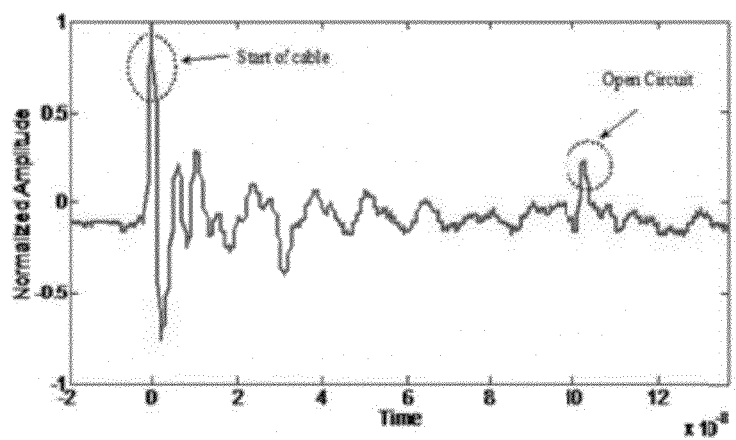
FIG. 18 illustrates normalized amplitude of the return signal from an open fault in the cable located 31 feet away from the CSW exciter in accordance with certain aspects of the present disclosure.

The dimension of the combined system was 13 cm×5 cm. The combined weight of the board was a couple of hundred grams. As seen in FIG. 16(b), the output of the pulse generator was connected to the output port of the coupler and the input port of the coupler went to the CSW exciter. CSW exciter induced and transmitted the pulse. The same port of the coupler connected to the CSW exciter also worked as a receiver of the returned pulse. The coupling port was connected to a 500 MHz Digital Oscilloscope. 600V unshielded XLPE cables of different length such as 7 feet, 14 feet, and 31 feet were utilized. FIGS. 17 and 18 show normalized amplitude of return signal versus time for various distances. When the time scale was converted to length, it was found that the detected open fault locations were at 7.45 feet, 14.175 feet, and 22.62 feet, respectively. So the maximum deviation of measured fault location from the actual fault location was below 8%. It is to be noted that the initial high reflection at starting comes from the start point of the cable where the pulse generator circuit is connected to the CSW exciter. It can be eliminated by impedance matching and filtering.

For rectangular pulse the bandwidth is inversely proportional to the pulse width. Wider pulses can travel further distances along the cable. The energy of the pulse proportional to the time duration. Pulse spread and reduce in amplitude as they travel larger distance. But wider pulse overshadows close distance defects. This space is called deadzone. Whereas the advantage of narrower pulse is, it is able to distinguish close distance faults.

In the interest of brevity and conciseness, any ranges of values set forth in this specification are to be construed as written description support for claims reciting any sub-ranges having endpoints which are whole number values within the specified range in question. By way of a hypothetical illustrative example, a disclosure in this specification of a range of 1-5 shall be considered to support claims to any of the following sub-ranges: 1-4; 1-3; 1-2; 2-5; 2-4; 2-3; 3-5; 3-4; and 4-5.

These and other modifications and variations to the present disclosure can be practiced by those of ordinary skill in the art, without departing from the spirit and scope of the present disclosure, which is more particularly set forth in the appended claims. In addition, it should be understood that aspects of the various embodiments can be interchanged both in whole or in part. Furthermore, those of ordinary skill in the art will appreciate that the foregoing description is by way of example only, and is not intended to limit the disclosure so as further described in such appended claims.

What is claimed:

1. A cable fault detection device comprising:
a monopole structure that is generally cylindrical, the monopole structure defining a slit that is parallel to an axis of the generally cylindrical monopole structure, the monopole structure having a first end and a second end, the slit passing from the first end to the second end, the slit being configured to allow the monopole structure to fit circumferentially around a cable having a longitudinal axis such that the cable axis is parallel to the axis of the generally cylindrical monopole structure and the cable extends beyond the first end and the second end of the monopole structure; and
a ground plane structure having a length, a width, and a thickness, wherein the length of the ground plane structure is configured to be generally parallel to the cable longitudinal axis when the monopole structure is placed circumferentially around the cable; and circuitry for generating a conformal surface wave step signal at the detection device, the signal upon generation, propagating along a surface of the cable or through a dielectric coating on the cable to detect the cable fault.

2. The device of claim 1, wherein the monopole structure comprises copper.

3. The device of claim 1, wherein the ground plane structure comprises copper.

4. The device of claim 1, wherein the ground plane structure further comprises insulating material.

5. The device of claim 1, wherein the ground plane structure is located more than 1 mm away from the monopole structure.

6. The device of claim 1, further comprising a power source configured to derive power from the cable.

7. The device of claim 6, wherein the power source is an energy scavenging system.

8. A method of cable fault detection comprising:

placing a monopole structure of a cable fault detection device around a cable, the cable having a longitudinal axis, the monopole structure being generally cylindrical and defining a longitudinal axis and a slit that is parallel to the longitudinal axis of the monopole structure, the slit being configured to allow the monopole structure to be placed around the cable such that the longitudinal axis of the cable is parallel to the longitudinal axis of the generally cylindrical monopole structure, the device further comprising a ground plane structure, wherein the ground plane structure has a length, a width, and a thickness and the length of the ground plane structure is generally parallel to the longitudinal axis of the cable;

exciting a conformal surface wave step signal from the cable fault detection device and along a surface of the cable or through a dielectric coating on the cable;

reflecting the step signal off of a fault in the cable; and analyzing the reflected step signal to detect the fault in the cable.

9. The method of claim 8, wherein the monopole structure comprises copper.

10. The method of claim 8, wherein the ground plane structure comprises copper.

11. The method of claim 8, wherein the ground plane structure further comprises insulating material.

12. The method of claim 8, wherein the ground plane structure is located more than 1 mm away from the monopole structure.

13. The method of claim 8, further comprising a power source configured to derive power from the cable.

14. The method of claim 13, wherein the power source is an energy scavenging system.

15. The method of claim 8, further comprising a circuit configured to generate an ultra narrow pulse.

* * * * *